United States Patent [19]

Thompson

[11] 4,241,303
[45] Dec. 23, 1980

[54] LINEARIZATION CIRCUIT

[75] Inventor: William L. Thompson, Chardon, Ohio

[73] Assignee: The Babcock & Wilcox Company, New York, N.Y.

[21] Appl. No.: 4,012

[22] Filed: Jan. 17, 1979

[51] Int. Cl.³ .................... G01K 7/10; G01R 15/10
[52] U.S. Cl. .................... 323/19; 73/362 AR; 324/132; 328/144
[58] Field of Search .................... 323/19.75 N; 307/4, 307/310; 324/132; 73/362 AR, 362 SC, 359 R, 359 A; 328/144; 364/573

[56] References Cited
U.S. PATENT DOCUMENTS

| | | | |
|---|---|---|---|
| 3,154,947 | 11/1964 | Poshadel et al. | 73/362 AR |
| 3,861,214 | 1/1975 | Siyahi | 73/362 AR |

FOREIGN PATENT DOCUMENTS

| | | | |
|---|---|---|---|
| 2544591 | 4/1977 | Fed. Rep. of Germany | 324/132 |
| 2710857 | 10/1978 | Fed. Rep. of Germany | 324/132 |

Primary Examiner—William H. Beha, Jr.
Attorney, Agent, or Firm—James A. Hudak; Vytas R. Matas; Joseph M. Maguire

[57] ABSTRACT

A voltage linearization circuit for use with a resistance thermometer device or a thermocouple to produce a nearly linear output signal from a non-linear input signal. The circuit produces a voltage proportional to the square of the input voltage through the use of operational amplifiers and field-effect transistors connected in voltage dividing arrangements, and combines this second order voltage, or a reduced magnitude thereof, with the original input voltage to produce a nearly linear output signal.

9 Claims, 3 Drawing Figures

LINEARIZATION CIRCUIT

TECHNICAL FIELD

This invention relates to a linearization circuit, and more particularly to a linearization circuit used in conjunction with either a resistance thermometer device or a thermocouple to linearize the output thereof.

BACKGROUND ART

Temperature transmitters typically use either a resistance thermometer device or a thermocouple as a means for measuring the temperature of the medium in which they are immersed. If a resistance thermometer device is used, the temperature transmitter must convert the change in resistance of the device, as the temperature changes, to voltage. However, if a thermocouple is used, no change in its output is needed because the thermocouple produces voltage directly. In either case, the resulting voltage is non-linear. Because of this non-linearity, errors of up to several percent of full scale occur with the present temperature transmitters.

In many cases, the errors caused by this non-linearity are not corrected, especially if the system involved does not require extreme accuracy. In other cases, the errors must be corrected in succeeding portions of the control system by relatively complex electronic techniques which are quite costly. Because of this, it has become desirable to develop a simple, inexpensive electronic means which can be used for correcting the non-linear voltage response of both resistance thermometer devices and thermocouples.

SUMMARY OF THE INVENTION

The present invention provides a solution to the aforementioned problems of response non-linearity for both resistance thermometer devices and thermocouples. It has been determined that if a voltage proportional to the square of a non-linear input voltage is produced and this voltage, or a reduced magnitude thereof, is subsequently combined with the original non-linear input voltage, the resulting voltage response curve is very nearly a straight line. The present invention accomplishes this task through the use of operational amplifiers, a matched pair of field-effect transistors, each of which is connected to an operational amplifier through feedback means, and resistors forming a voltage divider with each transistor. Since the field-effect transistors are matched and have their gates interconnected, the two voltage dividers are interdependent resulting in a voltage proportional to the square of the input voltage being formed at the output of the second operational amplifier. If this voltage, or a reduced magnitude thereof, is then combined with the original input voltage, an output voltage that is very nearly linear results.

DESCRIPTION OF THE PREFERRED EMBODIMENT

Figure 1:
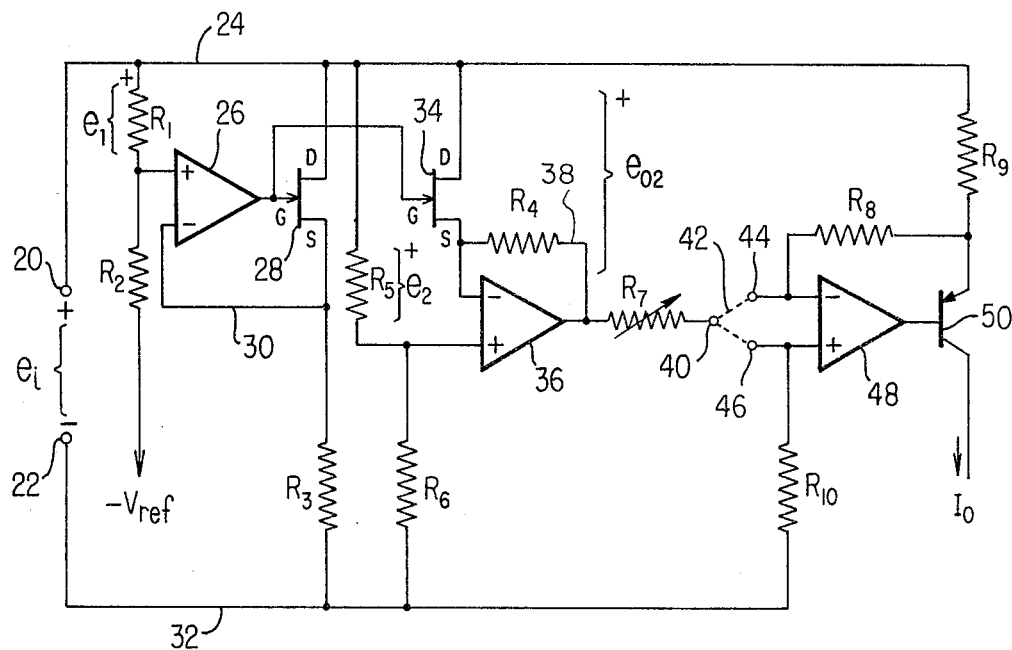
FIG. 1 is an electrical schematic of the invention of this disclosure.

Referring now to the drawings, FIG. 1 shows a linearization circuit for use with either a resistance thermometer device or a thermocouple. In FIG. 1, a temperature transmitter (not shown) is connected to input terminals 20, 22. The temperature transmitter typically transmits a dc signal for a specific temperature range and uses either a resistance thermometer device or a thermocouple as the temperature sensor. In the case of a resistance thermometer device, the transmitter converts the change in resistance of the device to a voltage signal. However, in the case of a thermocouple no modification in the form of the thermocouple output signal is required by the transmitter since the thermocouple output is already a voltage signal. Typically, the temperature transmitter requires no power supply of its own but is connected to a two-wire process control loop supplied by 24 volts dc with both power excitation and signal transmission accomplished over the same pair of conductors.

Input terminal 20 is connected via conductor 24 to one end of a resistor $R_1$, the opposite end of which is connected to the positive input of an operational amplifier 26 and to a resistor $R_2$. The opposite end of resistor $R_2$ is connected to a constant reference voltage shown as $-V_{ref}$. The output of operational amplifier 26 is connected to the gate of a field-effect transistor 28, which is one-half of a matched pair of field-effect transistors. The drain of field-effect transistor 28 is connected to input terminal 20 via conductor 24. The source of transistor 28 is connected via a feedback loop 30 to the negative input of operational amplifier 26 and is also connected to one end of a resistor $R_3$, the opposite end of which is connected to input terminal 22 via a conductor 32.

Conductor 24 is also connected to the drain of a field-effect transistor 34 which is the other half of the matched pair of field-effect transistors. The gate of transistor 34 is connected to the gate of field-effect transistor 28 and thus to the output of operational amplifier 26. The source of transistor 34 is connected to the negative input of an operational amplifier 36 whose output is connected via a feedback loop 38 through a resistor $R_4$ to its negative input. The positive input of operational amplifier 36 is connected to resistors $R_5$ and $R_6$, the opposite ends of which are connected to conductors 24 and 32, and thus to input terminals 20 and 22, respectively.

In addition to being connected to feedback loop 38, the output of operational amplifier 36 is also connected to one end of a variable resistor $R_7$, which can be a potentiometer, the opposite end of which is connected to the input terminal 40 of a two-position switch, shown generally as 42, and having output terminals 44 and 46 connected to the negative and positive inputs, respectively, of a summing amplifier 48. The negative input of summing amplifier 48 is also connected to conductor 24, and thus to input terminal 20, through resistors $R_8$ and $R_9$, and the positive input is connected to conductor 32, and thus to input terminal 22, through a resistor $R_{10}$. The output of summing amplifier 48 is connected to the base of a transistor 50 whose emitter is connected to the junction of resistors $R_8$ and $R_9$ resulting in resistor $R_8$ being in a feedback loop from the emitter of transistor 50 to the negative input of summing amplifier 48. The output of the linearization circuit is taken from the collector of transistor 50 and applied to the next phase of the temperature control process.

Figure 2:
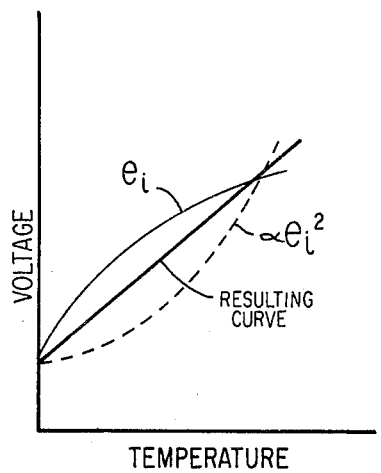
FIG. 2 is a graph of a typical voltage response curve for a resistance thermometer device, a second order voltage response curve for a resistance thermometer device, and the resulting voltage response curve when the latter two curves are combined.

Referring now to FIG. 2, the voltage Vs temperature response curve for a resistance thermometer device is shown. As illustrated, the resulting curve, shown by the solid line, is non-linear and concave downward. If this response curve is converted into a second order curve, the resulting curve, as shown by the dashed line, is concave upward. If this curve, or a reduced magnitude thereof, is then added to the original voltage response curve, the resulting curve is very nearly a straight line indicating that a linear output can be attained by combining the original non-linear voltage curve with the square of this non-linear voltage curve.

Figure 3:
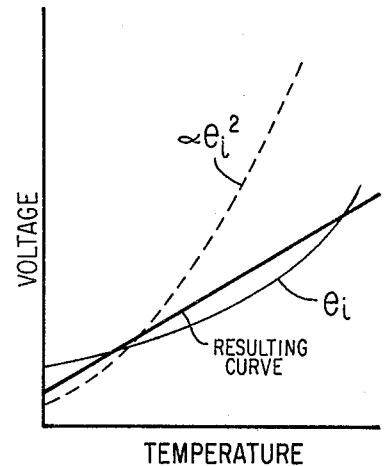
FIG. 3 is a graph of a typical voltage response curve for a thermocouple, a second order voltage response curve for a thermocouple, and the resulting voltage response curve when the latter two curves are combined.

A similar result can be attained with the voltage responsive curve for a thermocouple as shown in FIG. 3. In this FIG., the voltage Vs temperature response curve for a thermocouple is shown. In this case, the resulting curve, as shown by the solid line, is concave upward. If this curve is converted into a second order curve, the resulting curve, as shown by the dotted line, is also concave upward. If this curve, or a reduced magnitude thereof, is subtracted from the original voltage response curve, the result is again very nearly a straight line illustrating that whether a resistance thermometer device or a thermocouple is used as the temperature sensing means, a linear output can be attained by appropriately combining the original non-linear voltage curve with the square of this non-linear curve.

CIRCUIT OPERATION

Referring again to FIG. 1, the non-linear output voltage $e_i$ of a temperature transmitter using either a resistance thermometer device or a thermocouple as the sensing means is applied to input terminals 20, 22. A voltage $e_1$ is applied across resistor $R_1$ by resistor $R_2$ and voltage $-V_{ref}$. The operational amplifier 26 adjusts the circuit so that voltage $e_1$ also appears at the source of field-effect transistor 28 and is held constant and proportional to reference voltage $-V_{ref}$. Voltage $e_1$ is also applied to the negative input of operational amplifier 26 via feedback loop 30. This circuit arrangement creates a voltage divider whereby $$e_1 = \frac{R_{q1}}{R_{q1} + R_3} e_i \qquad \text{Equation \#1}$$

where $R_{q1}$ is the drain source resistance of field-effect transistor 28.

Similarly, with respect to operational amplifier 36, a voltage $e_2$ is applied across resistor $R_5$ and is thus also applied to the positive input of this amplifier. The operational amplifier 36 adjusts its output voltage $e_{O2}$ so that a voltage equal to $e_2$ is applied to the negative input of operational amplifier 36 and to the source of field-effect transistor 34 via feedback loop 38. The resulting output voltage $e_{O2}$ of operational amplifier 36 under these conditions can be expressed as $$e_{02} = \frac{R_4 + R_{q2}}{R_{q2}} e_2 \qquad \text{Equation \#2}$$

where $R_{q2}$ is the drain source resistance of field-effect transistor 36. Inasmuch as voltage $e_2$ is the result of a voltage divider arrangement involving resistors $R_5$ and $R_6$, this latter equation can be rewritten as $$e_{02} = \frac{R_4 + R_{q2}}{R_{q2}} e_i \frac{R_5}{R_5 + R_6} \qquad \text{Equation \#3}$$

As previously indicated, field-effect transistors 28, 34 are a matched pair resulting in drain source resistance $R_{q1}$ being equal to drain source resistance $R_{q2}$. In addition, resistors $R_3$ and $R_4$ are selected so as to be equal. Thus, substituting $R_{q2}$ for $R_{q1}$ and $R_4$ for $R_3$ in Equation #1 results in $$e_1 = \frac{R_{q2}}{R_{q2} + R_4} e_i \qquad \text{Equation \#4}$$

which can be rewritten as:

$$\frac{R_{q2} + R_4}{R_{q2}} = \frac{e_i}{e_1} \qquad \text{Equation \#5}$$

Substituting this latter expression for $$\frac{R_{q2} + R_4}{R_{q2}}$$

in
Equation #3 results in $$e_{02} = \frac{e_i}{e_1} e_i \frac{R_5}{R_5 + R_6}$$

which can be simplified and expressed as:

$$e_{O2} = e_i^2 K$$

where K is a constant

Thus, the output voltage $e_{O2}$ of operational amplifier 36 is proportional to the square of the input voltage $e_i$.

Referring again to FIG. 1, the output voltage $e_{O2}$ of operational amplifier 36 is then substantially reduced by variable resistance $R_7$ and applied to input terminal 40 of switch 42. Depending upon whether a resistance thermometer device or a thermocouple is being used, output voltage $e_{O2}$ is either added to or subtracted from the original input voltage $e_i$. If a resistance thermometer device is used, switch 42 is moved to its downward position connecting switch input 40 to switch output 46 causing output voltage $e_{O2}$ to be added to input voltage $e_i$ by summing amplifier 48. Conversely, if a thermocouple is used, switch 42 is moved to its upward position connecting switch input 40 to switch output 44 causing output voltage $e_{O2}$ to be subtracted from input voltage $e_i$ by summing amplifier 48. In either case, a very nearly linear output from operational amplifier 48 is formed. The end result is a very nearly linear output current through transistor 50 to succeeding portions of the control system even though the original input voltage is non-linear.

Variations of the present invention will be apparent to those having ordinary skill in the art and the invention is limited only by the spirit and scope of the following claims.

I claim:

1. A voltage linearization circuit comprising a non-linear input voltage, first voltage dividing means across said input voltage, second voltage dividing means connected to said input voltage and coupled to said first voltage dividing means, said second voltage dividing means having an output voltage proportional to the square of said input voltage, and means for combining said input voltage and output voltage proportional to the square of said input voltage resulting in an output signal that is approximately linear, said first voltage dividing means being comprised of first amplifying means and first switching means connected to the output of said first amplifying means, said first switching means also being connected to an input of said first amplifying means allowing said first amplifying means to adjust to a condition wherein the voltage applied to its inputs are equal.

2. The voltage linearization circuit as defined in claim 1 wherein said combining means comprises switching means and amplifying means electrically connected thereto.

3. The voltage linearization circuit as defined in claim 2 wherein said combining means adds said input voltage and said output voltage proportional to the square of said input voltage resulting in a nearly linear output signal.

4. The voltage linearization circuit as defined in claim 2 wherein said combining means subtracts said output voltage proportional to the square of said output voltage from said input voltage resulting in a nearly linear output signal.

5. A voltage linearization circuit comprising a nonlinear input voltage, first voltage dividing means across said input voltage, second voltage dividing means connected to said input voltage and coupled to said first voltage dividing means, said second voltage dividing means having an output voltage proportional to the square of said input voltage, and means for combining said input voltage and output voltage proportional to the square of said input voltage resulting in an output signal that is approximately linear, said second voltage dividing means being comprised of second amplifying means and second switching means connected to an input of said second amplifying means, said second switching means also being connected to an input of said second amplifying means allowing said second amplifying means to be adjusted to a condition wherein the voltages applied to its inputs are equal.

6. The voltage linearization circuit as defined in claim 5 further including means for varying the magnitude of said output voltage proportional to the square of said input voltage.

7. A voltage linearization circuit comprising a nonlinear input voltage, first voltage dividing means across said input voltage, second voltage dividing means connected to said input voltage and coupled to said first voltage dividing means, said second voltage dividing means having an output voltage proportional to the square of said input voltage, and means for combining said input voltage and output voltage proportional to the square of said input voltage resulting in an output signal that is approximately linear, said first voltage dividing means being comprised of first amplifying means and first switching means connected thereto, and said second voltage dividing means is comprised of second amplifying means and second switching means connected thereto, said second switching means also being connected to said first switching means.

8. A voltage linearization circuit as defined in claim 7 wherein said first and second switching means are field-effect transistors having their respective gates connected together.

9. A voltage linearization circuit comprising a nonlinear input voltage, first voltage dividing means across said input voltage, second voltage dividing means connected to said input voltage and coupled to said first voltage dividing means, said second voltage dividing means having an output voltage proportional to the square of said input voltage, and means for combining said input voltage and output voltage proportional to the square of said input voltage resulting in an output signal that is approximately linear, said first voltage dividing means being comprised of first amplifying means and first switching means connected thereto, and said second voltage dividing means is comprised of second amplifying means and second switching means connected thereto, said first switching means and said second switching means also being connected respectively to the input of said first amplifying means and the output of said second amplifying means allowing said first amplifying means and said second amplifying means to be adjusted to conditions wherein the respective input voltages to each of said first and second amplifying means are approximately equal.

* * * * *